United States Patent [19]
Nitta

[11] Patent Number: 5,606,176
[45] Date of Patent: Feb. 25, 1997

[54] STRAINED QUANTUM WELL STRUCTURE HAVING VARIABLE POLARIZATION DEPENDENCE AND OPTICAL DEVICE INCLUDING THE STRAINED QUANTUM WELL STRUCTURE

[75] Inventor: Jun Nitta, Tokyo, Japan

[73] Assignee: Canon Kabushiki Kaisha, Tokyo, Japan

[21] Appl. No.: 312,544

[22] Filed: Sep. 26, 1994

[30] Foreign Application Priority Data

Sep. 28, 1993 [JP] Japan ................... 5-264340

[51] Int. Cl.$^6$ ............ H01L 29/06; H01L 31/0328; H01L 31/0336
[52] U.S. Cl. ............... 257/18; 257/20; 257/21; 257/94; 372/43
[58] Field of Search ............... 257/18, 20, 21, 257/24, 97, 94; 372/43, 45, 47, 50

[56] References Cited

U.S. PATENT DOCUMENTS

| | | | |
|---|---|---|---|
| 5,079,774 | 1/1992 | Mendez et al. | 372/27 |
| 5,090,790 | 2/1992 | Zucker | 257/18 |
| 5,313,073 | 5/1994 | Kuroda et al. | 257/18 |
| 5,339,325 | 8/1994 | Kito et al. | 257/18 |
| 5,349,201 | 9/1994 | Stanchina et al. | 257/18 |
| 5,383,211 | 1/1995 | Van De Walle et al. | 372/43 |

FOREIGN PATENT DOCUMENTS

| | | | |
|---|---|---|---|
| 0606821 | 7/1994 | European Pat. Off. | H01S 3/19 |

OTHER PUBLICATIONS

"A Field–Effect Quantum Well Laser With Lateral Current Injection", D. Ahn et al., Journal of Applied Physics, vol. 64, No. 1, Jul. 1988, New York, US, pp. 440–442.

"Strained–Layer InGaAs Multiple Quantum Well Lasers Emitting at 1.5 Micron Wavelength", P. J. A.: Thijs et al., Japanese Journal of Applied Physics, Supplements, Extended Abstracts 22th Conf. on Solid State Devices and Materials (1990), Tokyo, Japan, Aug. 1990, pp. 541–544.

"Graded InGaAs/GaAs Strained Layer Quantum Well Laser", T–K Yoo et al., Applied Physics Letters, vol. 62, No. 18, May 1993, New York US, pp. 2239–2241.

"Quantum–Confined Field–Effect Light Emitters: Device Physics and Experiments", M. Okuda, et al., IEEE Journal of Quantum Electronics, vol. 26, No. 9, Sep. 1990.

Hidenako Tanaka, et al., "TE/TM mode switching of GaAsP strained quantum–well laser diodes", SPIE Laser Diode Technology and Applications V, vol. 1850, 1993, pp. 145–152.

*Primary Examiner*—Sara W. Crane
*Attorney, Agent, or Firm*—Fitzpatrick, Cella, Harper & Scinto

[57] ABSTRACT

A strained quantum well structure comprises a substrate, and a strained quantum well. The strained quantum well has at least one well layer and a plurality of barrier layers. The well layer is sandwiched by the barrier layers. At least a portion of the well layer and the barrier layers is composed of semiconductor crystal whose amount of strain is distributed, and the band structure of the quantum well is constructed so that the transition in the quantum well layer can be exchanged between states in which first polarization-state, typically transverse electric, transition is dominant and in which second polarization-state, typically transverse magnetic, transition is dominant.

12 Claims, 16 Drawing Sheets

STRAINED QUANTUM WELL STRUCTURE HAVING VARIABLE POLARIZATION DEPENDENCE AND OPTICAL DEVICE INCLUDING THE STRAINED QUANTUM WELL STRUCTURE

BACKGROUND OF THE INVENTION

1. Field of the Invention

The present invention relates to a strained quantum well structure and an optical device including such a strained quantum well structure, such as a semiconductor laser or a wavelength filter.

2. Description of Related Background Art

Semiconductor lasers, which output a transverse magnetic (TM) polarized beam, have been known. Such lasers have active layers including strained quantum well structures into whose quantum wells a tensile strain is introduced.

In a conventional semiconductor laser, once a strained quantum well structure has been formed, it is impossible to change the polarization direction of its light oscillation because its energy band structure is fixed.

SUMMARY OF THE INVENTION

It is an object of the present invention to provide a strained quantum well structure, which has a distributed amount of the strain in its quantum well, and an optical device including the strained quantum well, such as a semiconductor laser.

According to one aspect of the present invention which achieves the objective, a strained quantum well structure comprises a substrate, and a strained quantum well which has at least one well layer and a plurality of barrier layers. The well layer is sandwiched by the barrier layers. At least a portion of the well layer and the barrier layers is constructed of semiconductor crystal having a distributed amount of strain. The band structure of the quantum well is constructed so that a transition in the well layer can be exchanged between states in which first polarization-state (e.g., transverse electric) transition is dominant and in which second polarization-state (e.g., transverse magnetic) transition is dominant.

According to another aspect of the present invention which achieves the objective, a strained quantum well structure comprises a substrate, and a strained quantum well which has at least one well layer and a plurality of barrier layers. The well layer is sandwiched by the barrier layers. At least a portion of the well layer and the barrier layers is constructed of semiconductor crystal whose lattice constant is different from the lattice constant of the substrate, and the amount of lattice constant difference between the substrate and the semiconductor crystal varies.

According to still another aspect of the present invention which achieves the objective, an optical device comprises a substrate, a strained quantum well structure, at least one of current injecting means for injecting current into the strained quantum well structure and reverse-voltage applying means for applying a reverse voltage to the strained quantum well structure, and voltage applying means for applying a voltage to the strained quantum well structure independently from the current injecting means and the reverse-voltage applying means. The strained quantum well structure has at least one well layer and a plurality of barrier layers. The well layer is sandwiched by the barrier layers. At least a portion of the well layer and the barrier layers is constructed of semiconductor crystal whose lattice constant is different from the lattice constant of the substrate, and the amount of lattice constant difference between the substrate and the semiconductor crystal varies.

Specifically, the strained quantum well structure may be constructed so that the strained quantum well would have band gap energies of two values if each region of the strained quantum well were formed on a semiconductor substrate which has the same lattice constant as the region. The strained quantum well structure may also be constructed so that the strained quantum well would have band gap energy gradually varying in the well layer if each region of the strained quantum well structure were formed on a semiconductor substrate which has the same lattice constant as the region. The lattice constant difference may vary from a large value to a small value when the band gap energy linearly varies from a small value to a large value in the well layer of the single quantum well structure.

These and other objects, features, and advantages of the present invention will become more apparent upon consideration of the following detailed description of the preferred embodiments when read in conjunction with the attached drawings.

FIRST EMBODIMENT

Figure 1:
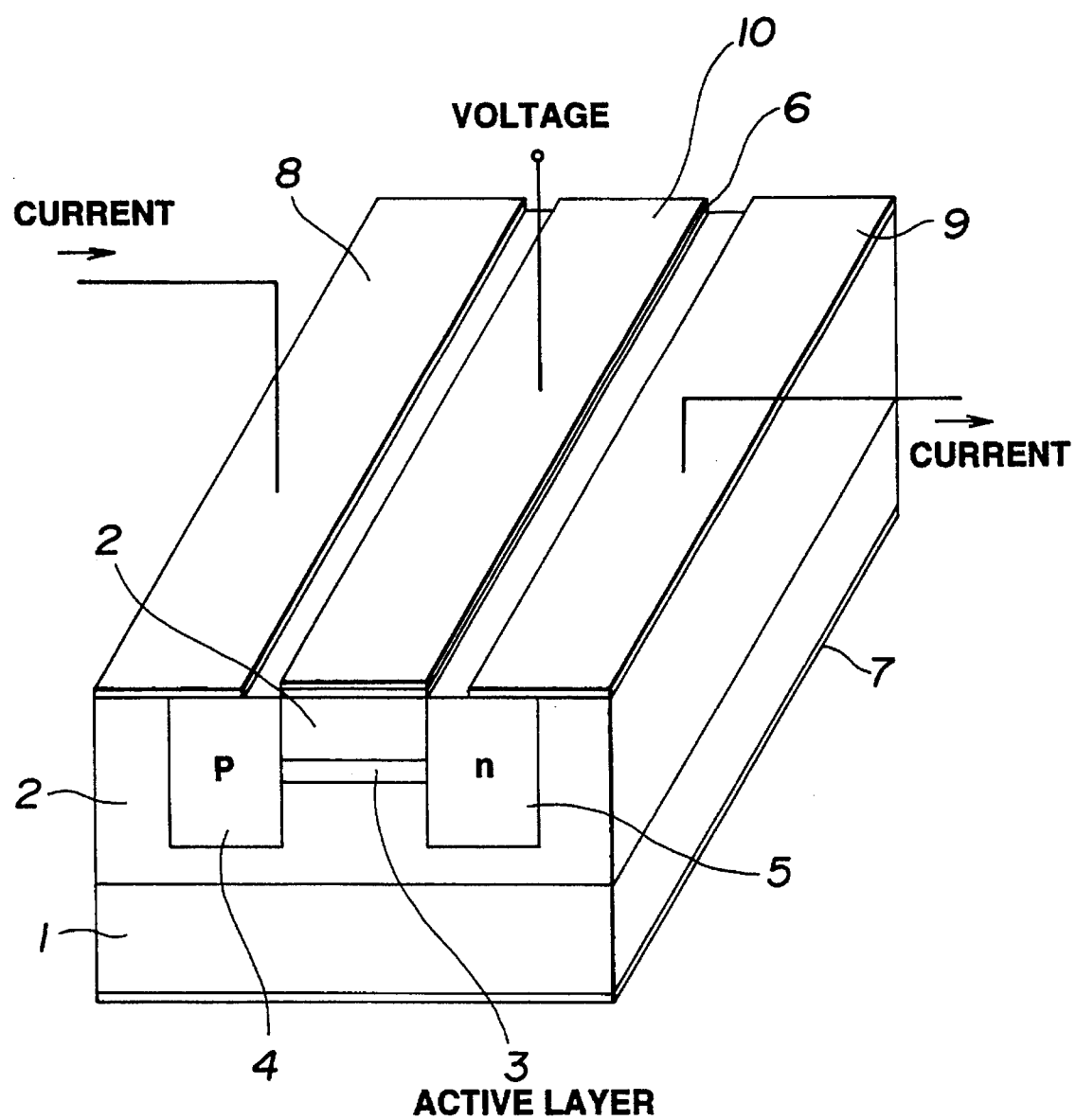
FIG. 1 is a perspective view illustrating a first embodiment of the present invention.

FIG. 1 shows a first embodiment of the present invention. In FIG. 1, reference numeral 1 designates a semi-insulating substrate of InP, reference numeral 2 designates a semi-insulating clad layer of InGaAsP, reference numeral 3 designates an active layer which is constructed as a strained quantum well structure by sandwiching a quantum well layer between a pair of barrier layers, and reference numeral 4 designates a conductive semiconductor burying layer of p-type InGaAsP. Further, reference numeral 5 designates another conductive semiconductor burying layer of n-type InGaAsP which has a conduction type different from that of the burying layer 4, reference numeral 6 designates an insulating film of $SiO_2$, reference numerals 7 and 10 respectively designate electrodes for applying a voltage across the active layer 3, and reference numerals 8 and 9 respectively designate electrodes for injecting current into the active layer 3.

Figure 2:
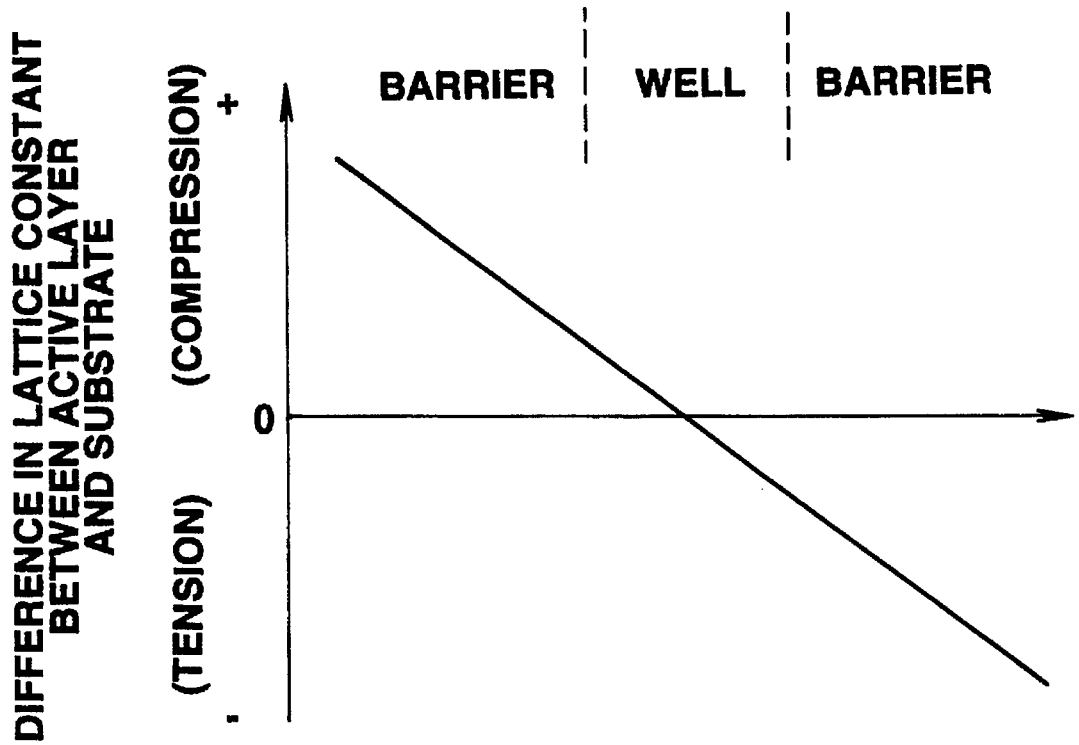
FIG. 2 is a graph illustrating the destribution of a lattice constant difference between a substrate and an active layer constructed in accord with the invention.
Figure 3:
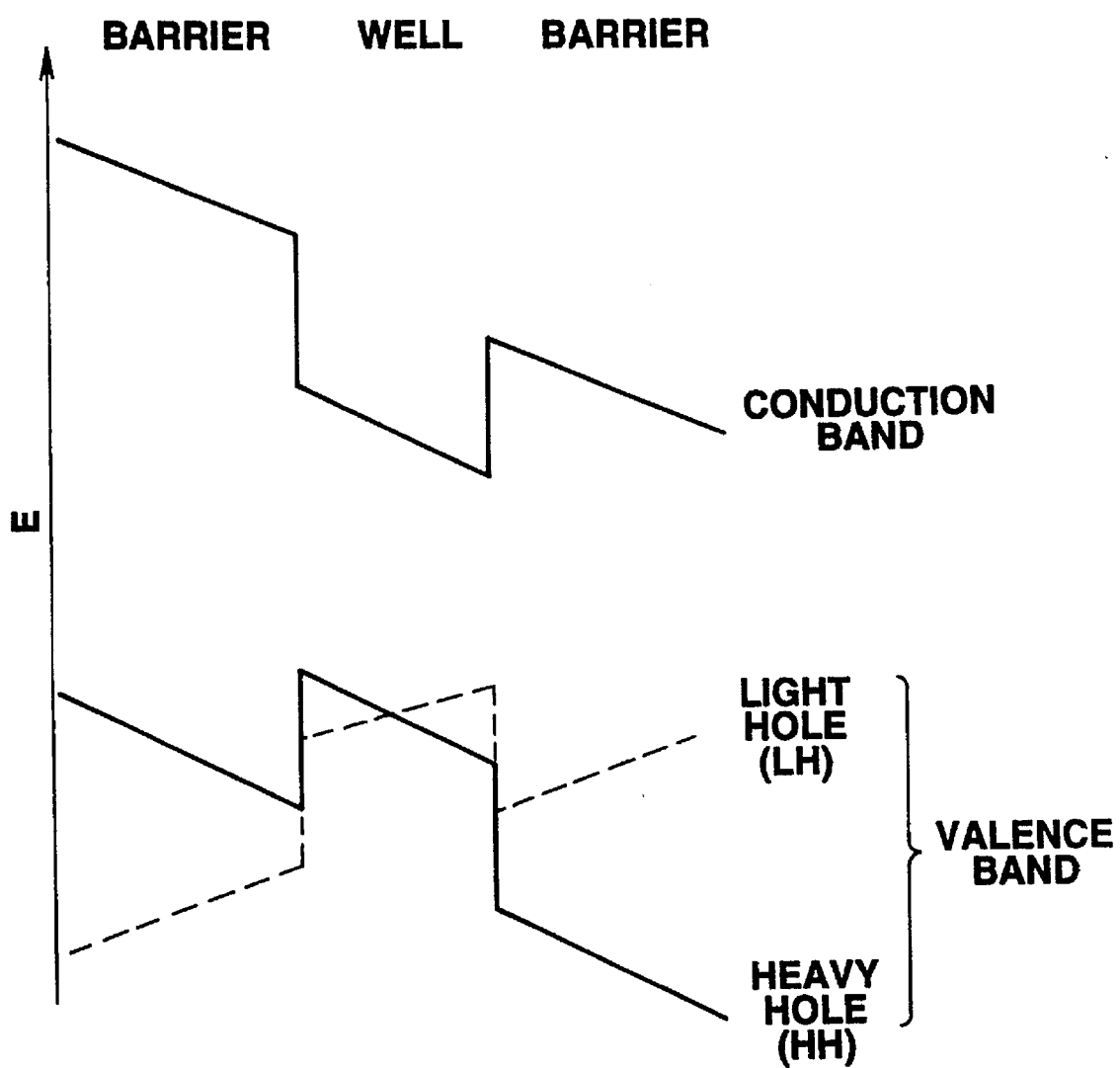
FIG. 3 is a band diagram illustrating a band structure during a non-voltage applied state.
Figure 5:
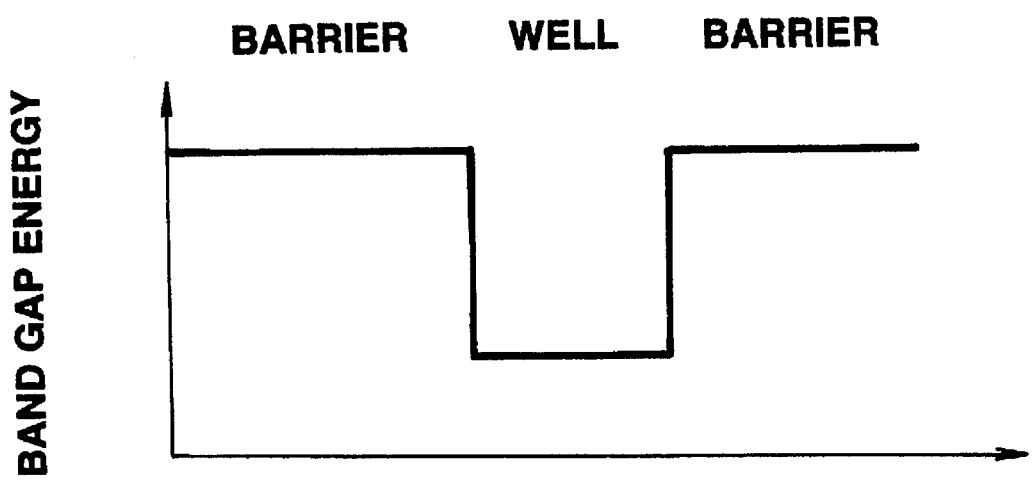
FIG. 5 is a graph illustrating a square well potential band gap energy.

The structure of the active layer 3 will be described in connection with FIG. 2. In the first embodiment, the active layer includes a single quantum well structure formed in a waveguide having a graded index-separate confinement heterostructure (GRIN-SCH). As shown in FIG. 2, a difference in lattice constant between the active layer 3 and the substrate 1 linearly varies from one barrier layer towards the other barrier layer from a positive value to a negative value. Furthermore, the structure is constructed so that the band gap energy of the single quantum well structure, in the absence of strain effects, is a substantially distortion free square well, as shown in FIG. 5. Such a structure is fabricated by controlling x and y of $In_xGa_{1-x}As_yP_{1-y}$. The band gap energy structure, when strain effects are included, is "tilted" as shown in FIG. 3. This is achieved by controlling the mole fraction of $In_xGa_{1-x}As_yP_{1-y}$ during layering, in a manner that satisfies the above-mentioned two relations concerning the lattice constant and the band gap energy.

The principle of the present invention will be described below using an example in which a well layer portion of a quantum well structure is constructed of material whose lattice constant varies while its band gap remains unchanged. The lattice constant is caused to vary from a value larger than that of the substrate to a value smaller than that of the substrate.

When the well layer is constructed of material whose lattice constant is different from that of the substrate, a stress occurs in the crystal lattice of the well layer portion and its energy band structure is changed. When the lattice constant is larger than that of the substrate, the energy level or band end of heavy holes in the valence band is shifted towards a lower energy state than its original band end level (a state in which no stress is present). The band end of light holes in the valence band is shifted towards a higher energy state. On the other hand, where the lattice constant is smaller than that of the substrate, the band end of heavy holes in the valence band is shifted towards a higher energy state than its original band end level (a state in which no stress is present), and the band end of light holes in the valence band is shifted towards a lower energy state. A change in the band structure of the conduction band is similar to the change of the valence band of heavy holes.

Figure 7:
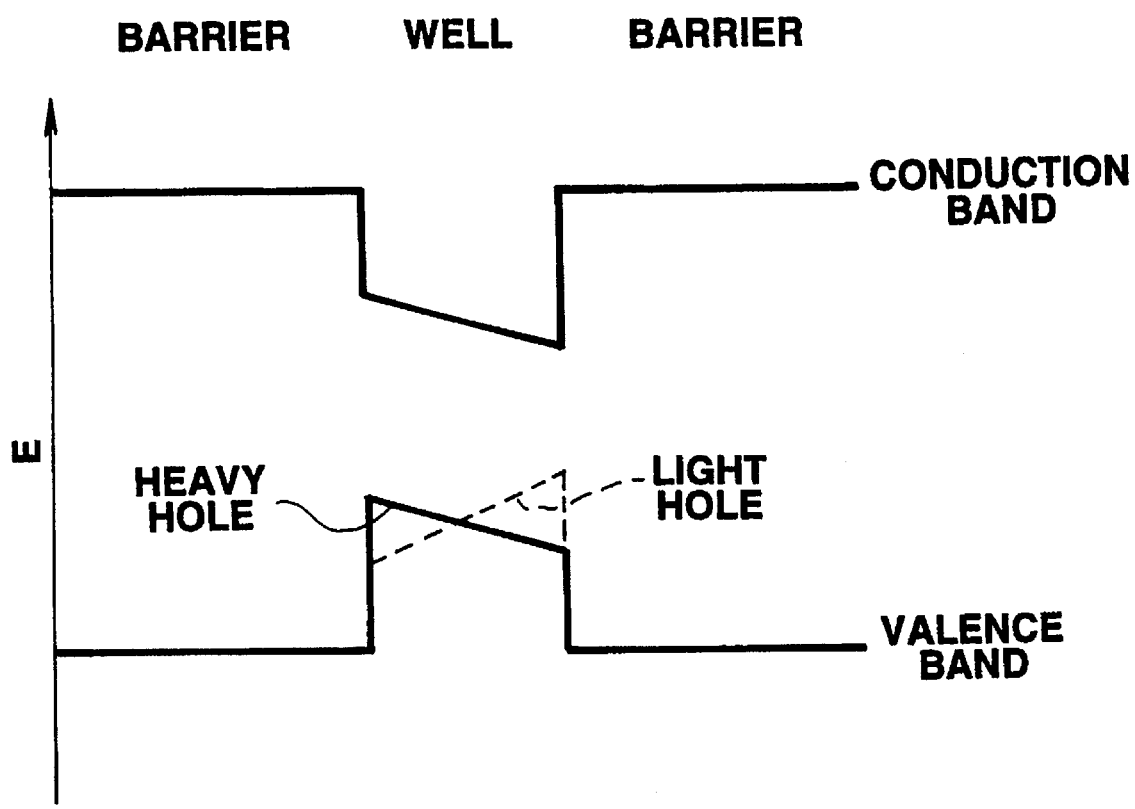
FIG. 7 is a band diagram illustrating an additional band structure during a non-voltage applied state.

As a result, the band structure of a strained quantum well exhibits a difference in valence band edges between heavy holes and light holes (for example, as shown in FIG. 7). Since he optical transition probability is larger between similar band shapes than between different band shapes, the transition between light holes in the valence band and the conduction band (TM transition) is dominant and TM polarized light is output from the device (in the example of FIG. 7).

On the other hand, when an external electric field is applied across the quantum well structure, the band shape is changed, or "tilted" to conform to the potential drop, When the appropriate voltage magnitude and sense are applied, the transition between heavy holes in the valence band and the conduction band (TE transition) becomes dominant and TE polarized light is output from the device.

The operation of the first embodiment will be described. The voltage electrodes 7 and 10 are connected together and current is injected into the active layer 3 by means of current injecting electrodes 8 and 9. In such a non-voltage applied state, the band structure of the active layer 3 is "tilted" as shown in FIG. 3, so that the transition between conduction band levels and light holes (LH) in the valence band is dominant. Hence TM polarized light is output from the semiconductor laser.

Figure 4:
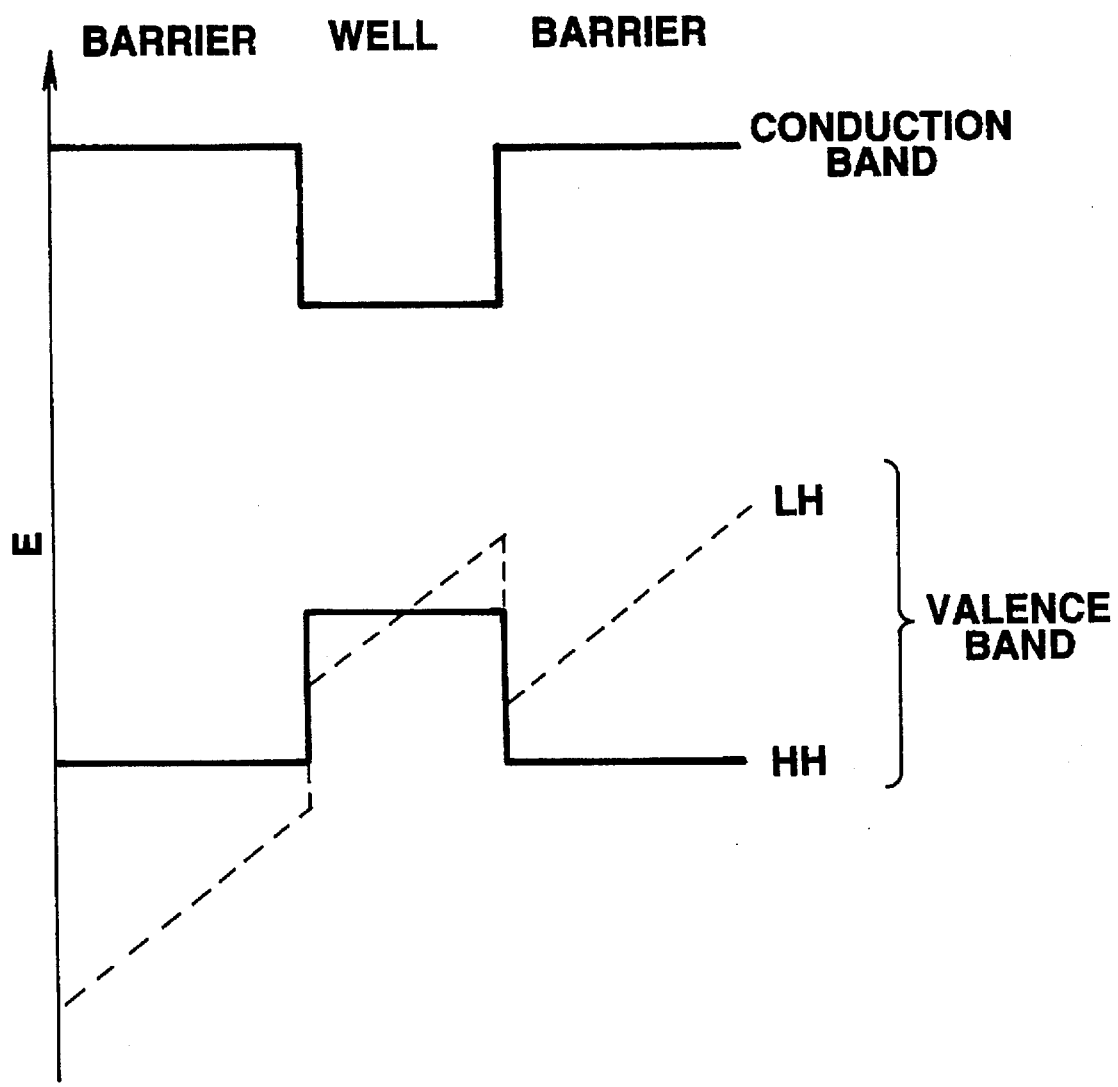
FIG. 4 is a band diagram illustrating the band structure during a voltage applied state.

On the other hand, when a voltage is applied between electrodes 7 and 10, the band structure of the single quantum well structure portion is changed to a state as shown in FIG. 4. In such a voltage applied state, the transition between conduction band levels and heavy holes (HH) in the valence band is dominant. Hence transverse electric (TE) polarized light is output from the semiconductor laser.

Figure 6:
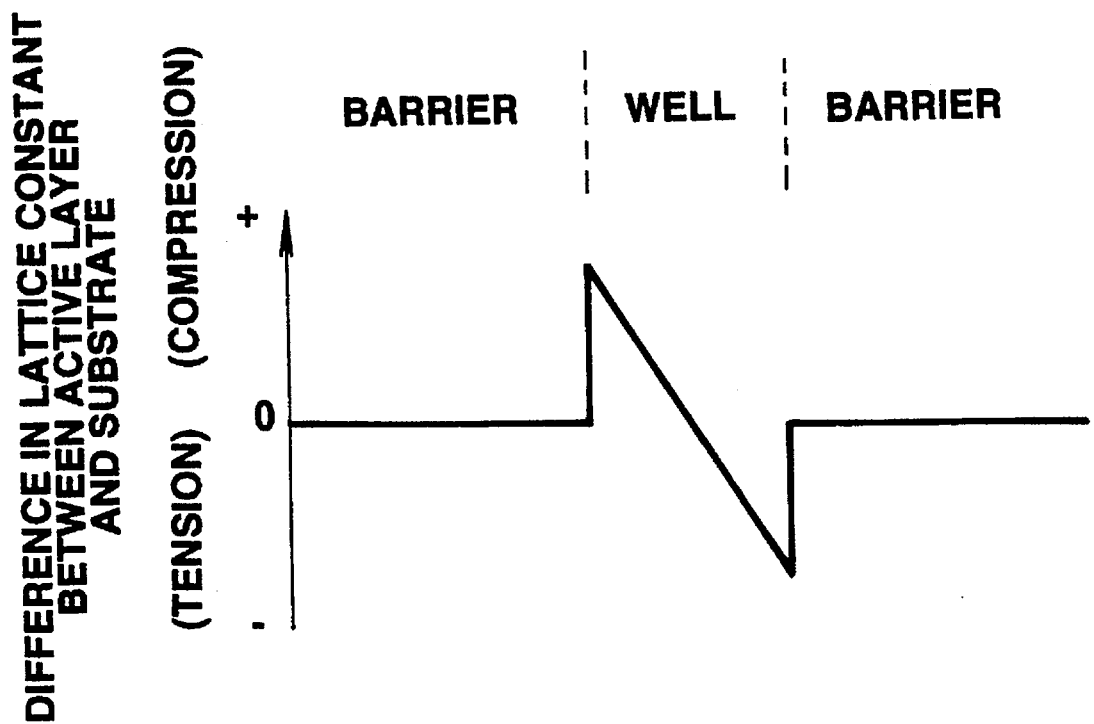
FIG. 6 is a graph illustrating a further destribution of a lattice constant difference between a substrate and an active layer constructed in accord with the invention.
Figure 8:
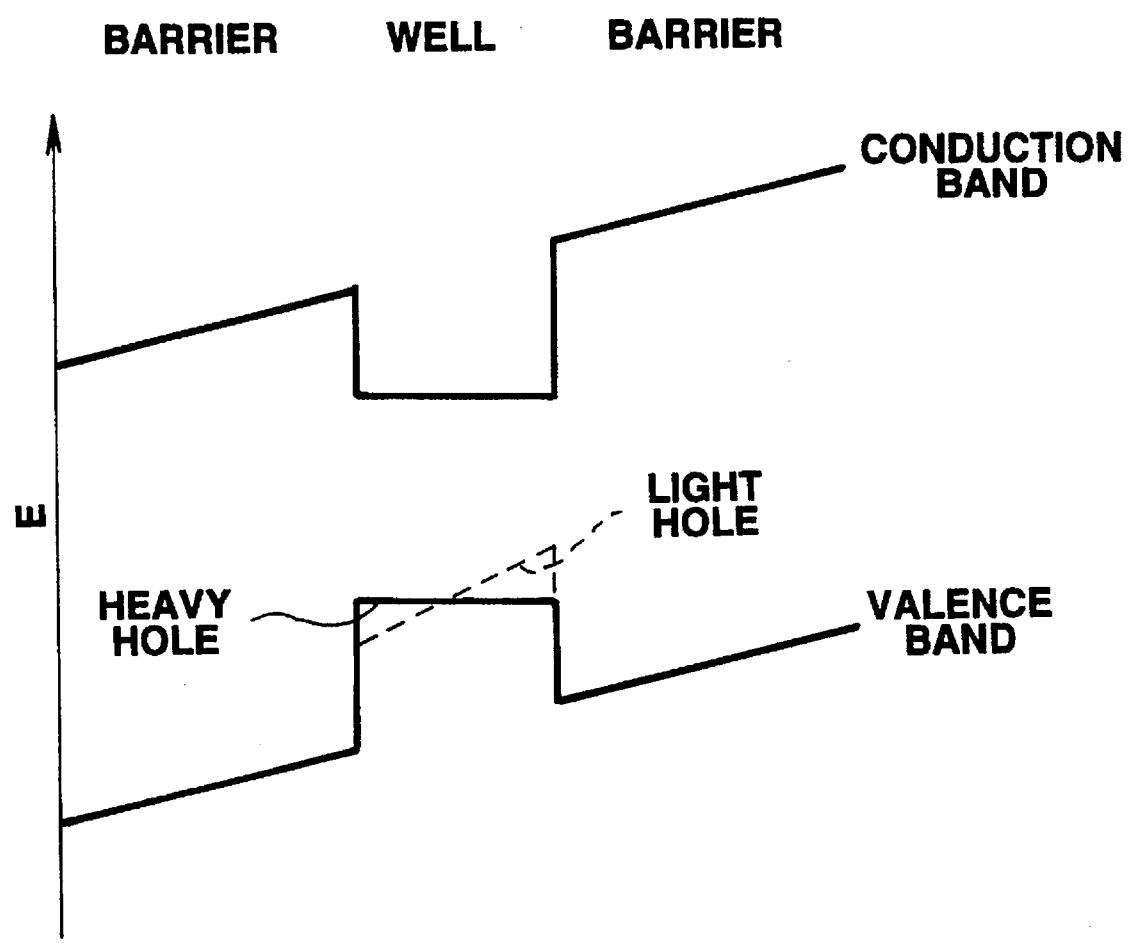
FIG. 8 is a band diagram illustrating an additional band structure during a voltage applied state.

The first embodiment can be modified by changing the single quantum well structure portion as shown in FIGS. 6–8. $In_xGa_{1-x}As_yP_{1-y}$ is layered such that the energy band gap of respective portions of the quantum well structure is formed as shown in FIG. 5 and the relationship between the lattice constant and the substrate is changed to that shown in FIG. 6. The band structure under a non-voltage applied state where electrodes 7 and 10 are connected in common is shown in FIG. 7. In such a non-voltage applied state, the transition between conduction band levels and light holes in the valence band is dominant and hence TM polarized light is output from the device. On the other hand, when a voltage is applied between electrodes 7 and 10, the band structure of the single quantum well structure portion is changed to a state as shown in FIG. 8. In such a voltage applied state, the transition between conduction band levels and heavy holes in the valence band is dominant and hence TE polarized light is output from the device.

Figure 9:
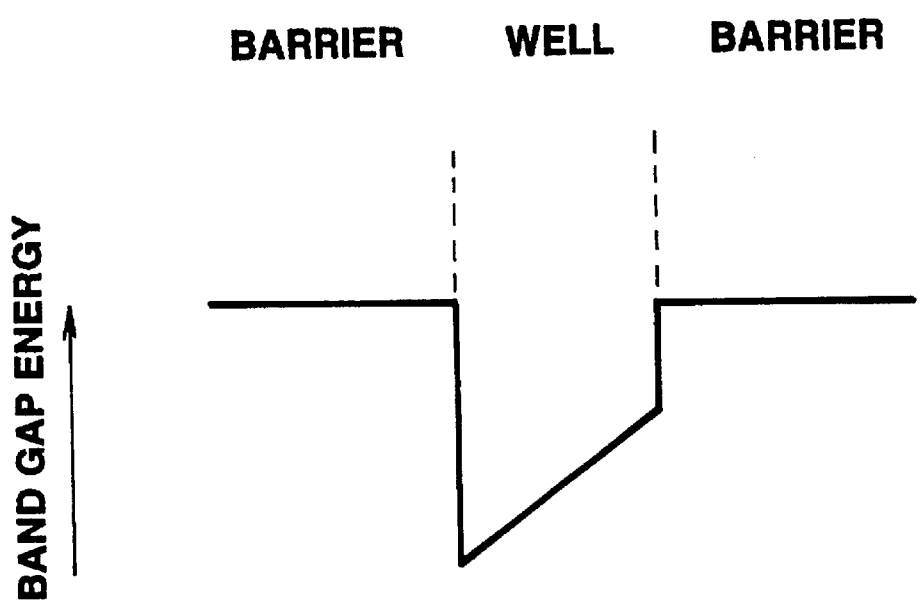
FIG. 9 is a band diagram illustrating a band gap energy of an active layer of a further embodiment of the invention.
Figure 10:
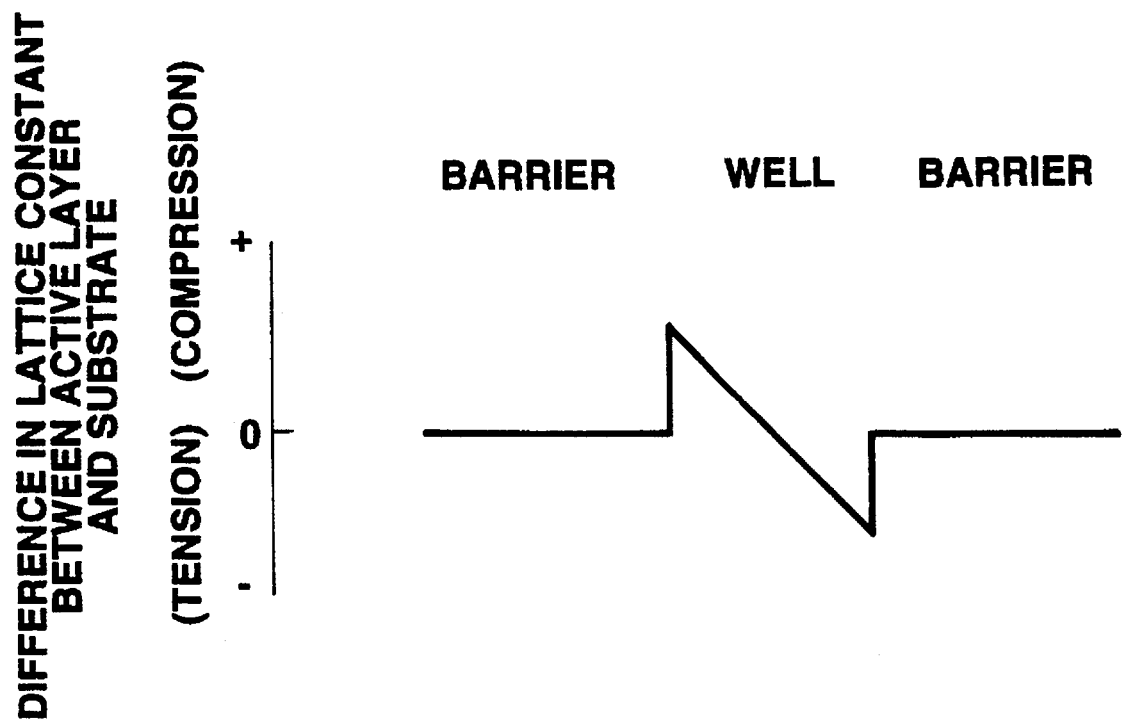
FIG. 10 is a graph illustrating an additional destribution of a lattice constant difference between a substrate and an active layer constructed in accord with the invention.
Figure 11:
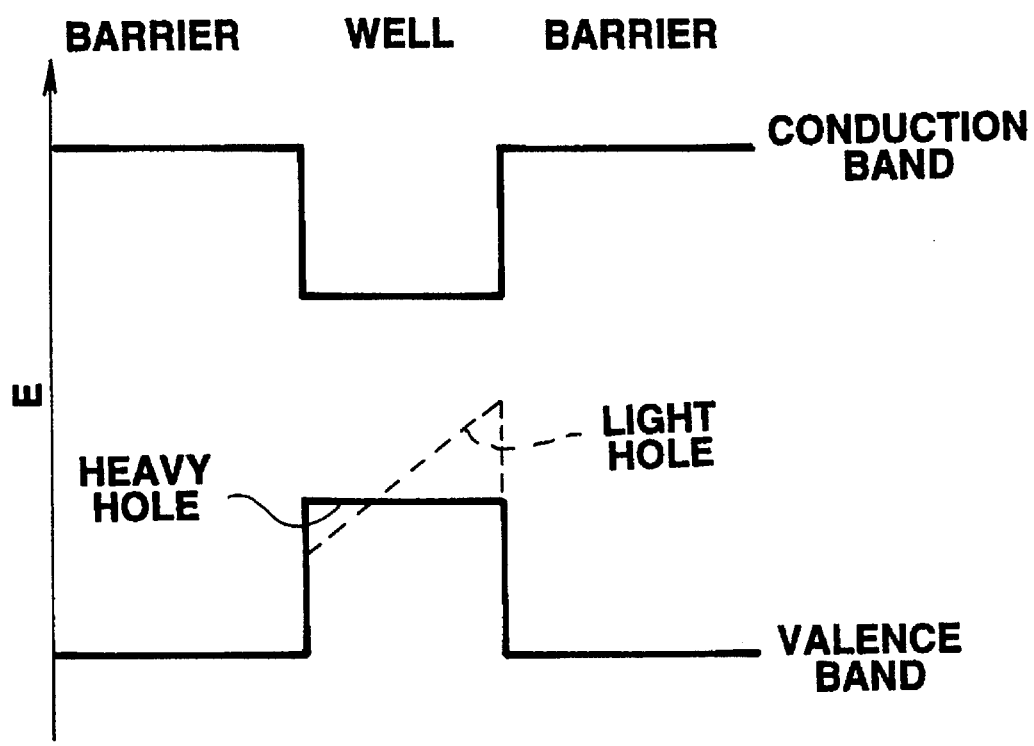
FIG. 11 is a band diagram illustrating yet another band structure during a non-voltage applied state.
Figure 12:
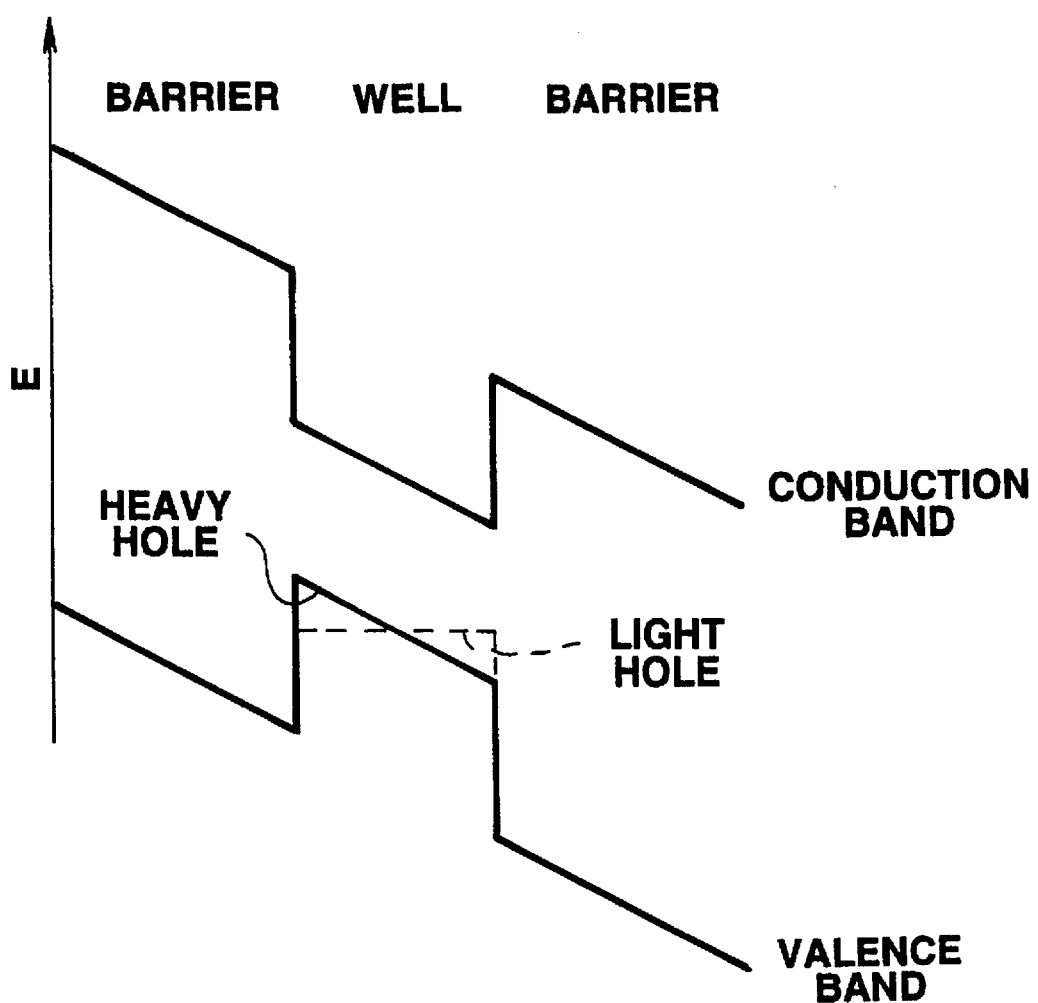
FIG. 12 is a band diagram illustrating yet another band structure during a voltage applied state.

The first embodiment can be further modified by changing the single quantum well structure portion as shown in FIGS. 9–12. FIG. 9 illustrates the structure of the band gap energy. FIG. 10 depicts a graph of the strain introduced into the single quantum well structure. When a semiconductor crystal, which satisfies the relationships of FIGS. 9 and 10, is formed, the band structure becomes as shown in FIG. 11 when electrodes 7 and 10 are connected together and a non-voltage applied state is established. In such a non-voltage applied state, when current is injected into the active layer 3 by electrodes 8 and 9, the transition between conduction band levels and heavy holes in the valence band is dominant and hence TE polarized light is output from the device. On the other hand, when a voltage is applied between electrodes 7 and 10, the band structure of the single quantum well structure portion is changed to a state as shown in FIG. 12. In such a voltage applied state, the transition between conduction band levels and light holes in the valence band is dominant and hence TM polarized light is output from the semiconductor device.

In the first embodiment, the active layer 3 comprises a single quantum well structure, but the structure is not limited thereto. A multiquantum well structure, which includes a plurality of strained single quantum wells, may be employed.

Further, a quarternary mixed crystal InGaAsP is desribed as the semiconductor material forming the active layer 3, but the material is not limited thereto. Any semiconductor material that may be used to construct a semiconductor laser and whose lattice constant and band gap energy can be independently controlled, can comprise a strained quantum well structure and a semiconductor laser according to the present invention.

SECOND EMBODIMENT

Figure 13:
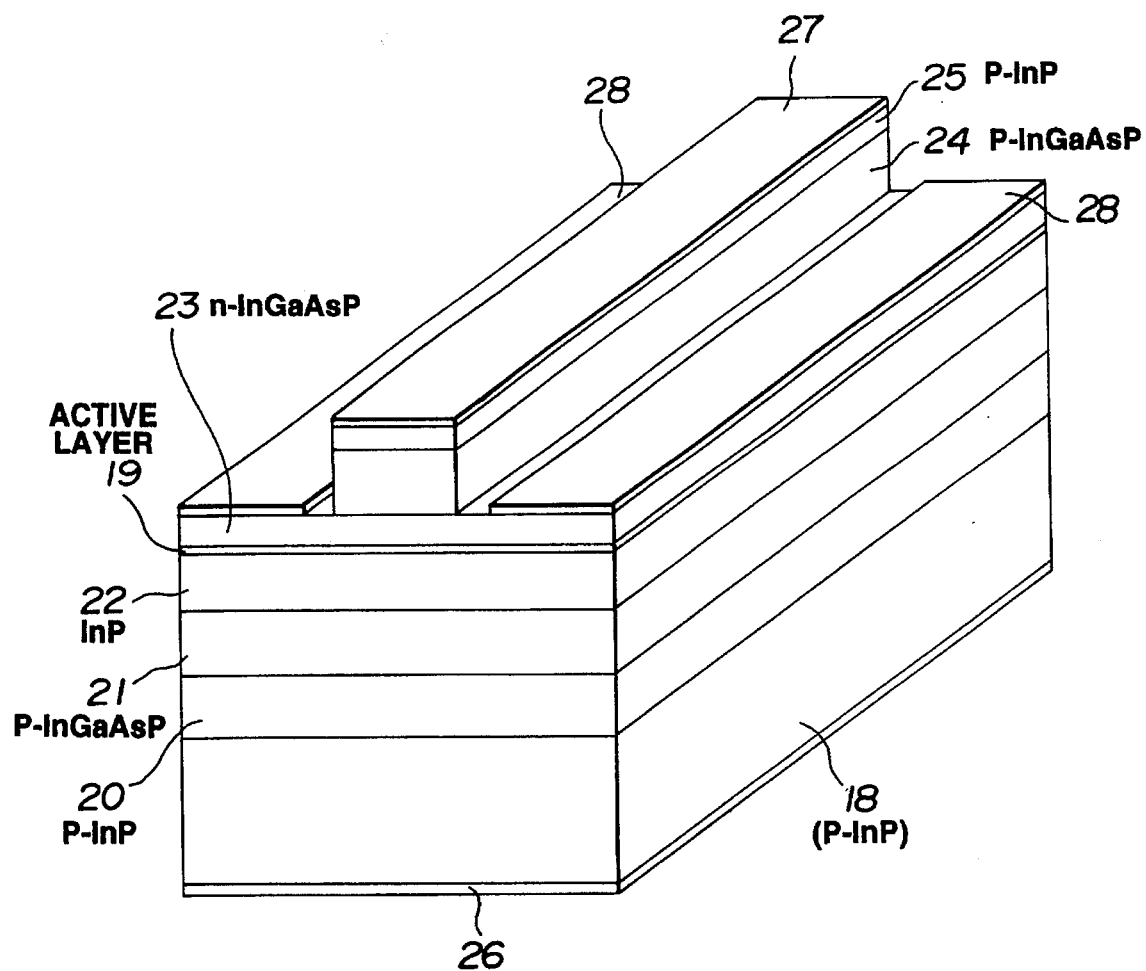
FIG. 13 is a perspective view illustrating a second embodiment of the present invention.

FIG. 13 shows a second embodiment of the present invention. In this embodiment, a strained quantum well structure of the present invention is applied to a further type of semiconductor structure shown in FIGS. 13 and 14. The device shown in FIG. 13 is fabricated by including a strained quantum well, in accord with the persent invention to a quantum confined light emitting device disclosed in IEEE Journal of Quantum Electronics, vol. 26, No. 9, pp. 1481–1491.

In FIG. 13, reference numeral 18 designates a substrate of p-type InP, reference numeral 20 designates a buffer layer of p-type InP, reference numeral 21 designates a p-type InGaAsP layer, reference numeral 22 designates an undoped InP layer, reference numeral 23 designates an n-type InGaAsP layer, reference numeral 24 designates a p-type InGaAsP layer, reference numeral 25 designates a p-type InP cap layer, reference numeral 26 designates a collector electrode, reference numeral 27 designates an emitter electrode, and reference numeral 28 designates a base electrode. Further, reference numeral 19 designates an active layer which has any one of the strained quantum well structures described in connection with FIGS. 2–12.

Figure 14:
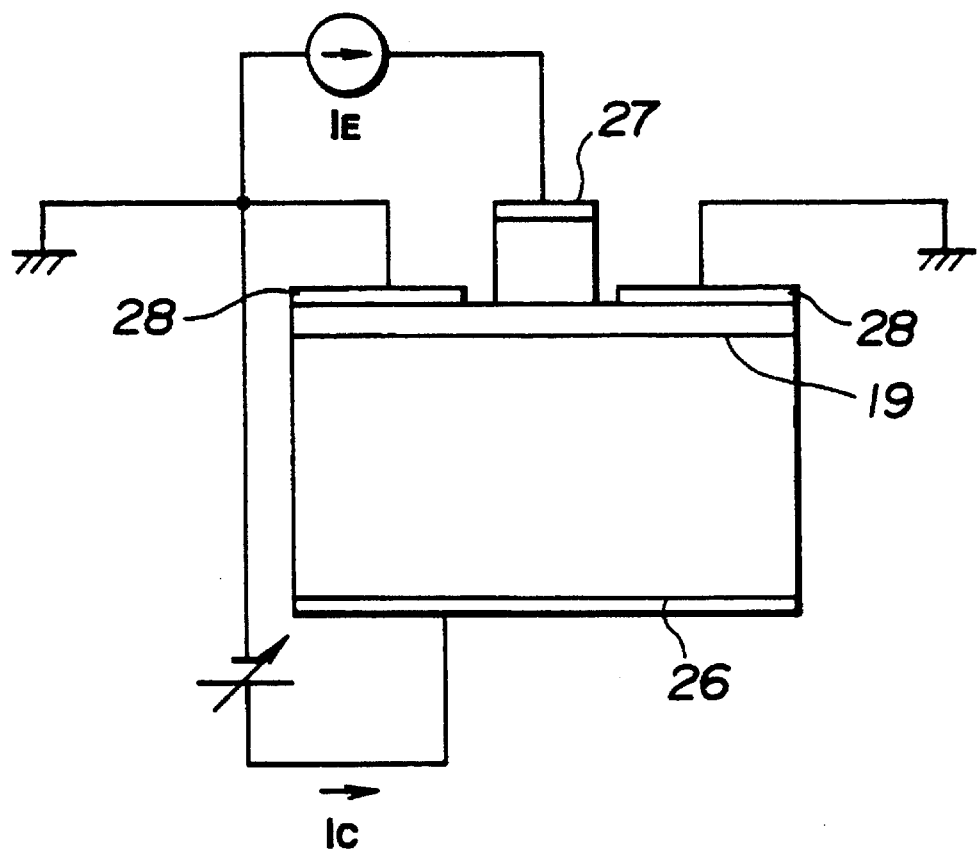
FIG. 14 illustrates the electric connection structure of the second embodiment of the present invention.

FIG. 14 shows the electric connections of the device of this embodiment. A voltage to be applied across the strained quantum well structure of the active layer 19 is adjusted by a voltage between the base electrode 28 and the collector electrode 26. Current is injected into the strained quantum well structure using emitter electrode 27 and collector electrode 26.

The device is operated in a manner similar to the first embodiment. A device is constructed including a strained quantum well, a voltage is applied across the strained quantum well structure to change the band structure and current is injected into the quantum well structure to operate the device. Thus, the oscillation polarization state of output light from the device can be changed by varying the applied voltage.

In the above-discussed embodiments, the present invention has been described with reference to a semiconductor laser, but a strained quantum well structure of the present invention can be applied to other optical devices, such as absorption type optical modulators and semiconductor optical amplifiers.

In the case of an optical amplifier, the device operates as a traveling wave type optical amplifier by forming antireflection coatings on end facets shown in FIGS. 1 and 13. Gain can be increased either for TE light or for TM light, by varying the applied voltage.

In the case of an optical modulator, the device operates as an absorption type optical modifier by, for example, varying the amount of a reverse bias voltage applied between the current electrodes 8 and 9 illustrated in FIG. 1. In this state, the device can be optimized to output either TE light or TM light, by varying a voltage applied between the voltage electrodes 7 and 10.

Furthermore, the distribution of strain in a quantum well structure is not limited to those described in connection with the above embodiments. Various shapes can be adopted. For example, the distribution of strain may exist only in a tensile strain or a compression strain area. To summarize, the band structure of the strained quantum well structure need only be constructed so that transitions in the quantum well layer can be exchanged, between states in which TE is dominant and in which TM is dominant, by an externally applied voltage.

Figure 15:
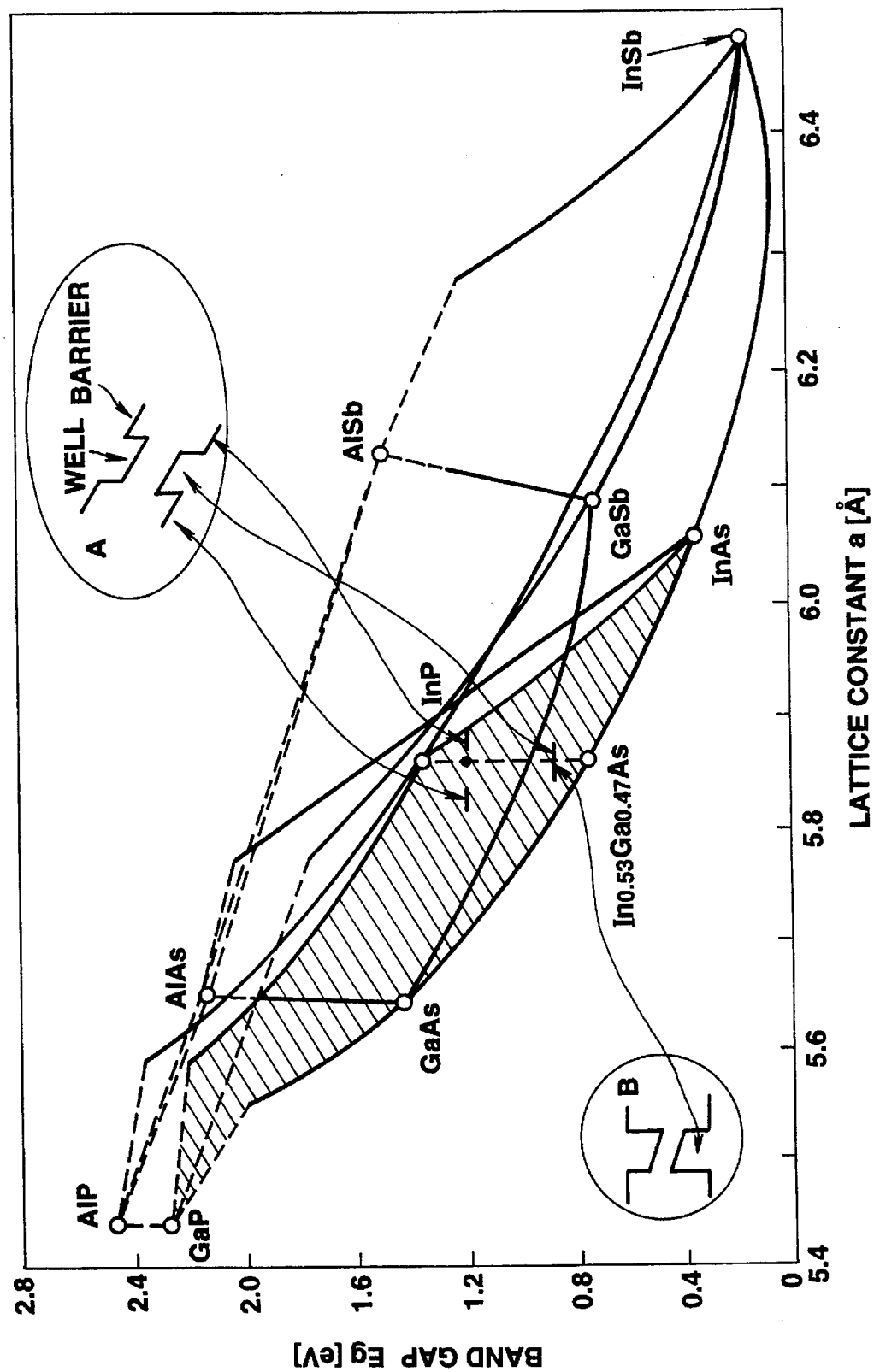
FIG. 15 is a composition phase diagram illustrating lattice constant versus band gap energy.

The manner of controlling mole fractions x and y of $In_xGa_{1-x}As_yP_{1-y}$ will be described in more detail. The well-known relationship between mole fraction, lattice constant and band gap energy is depicted in the material composition phase diagrams of FIGS. 15 and 16. For example, when strain varying from tension to compression is desired in both the barrier and the quantum well layer, the quantum well structure would be constructed of material indicated by region A in FIG. 15. The well layer portion is constructed of material whose band gap energy is approximately 0.8 eV in its strain-relaxed state and whose lattice constant gradually varies by controlling the InGa ratio. The barrier layer is constructed of material whose band gap energy is approximately 1.2 eV in its strain-relaxed state and whose lattice constant also gradually varies. Region B in FIG. 15 indicates the material composition used when strain is desired only in the well layer, and the barrier layer is constructed of material having the same lattice constant as the substrate.

Figure 16:
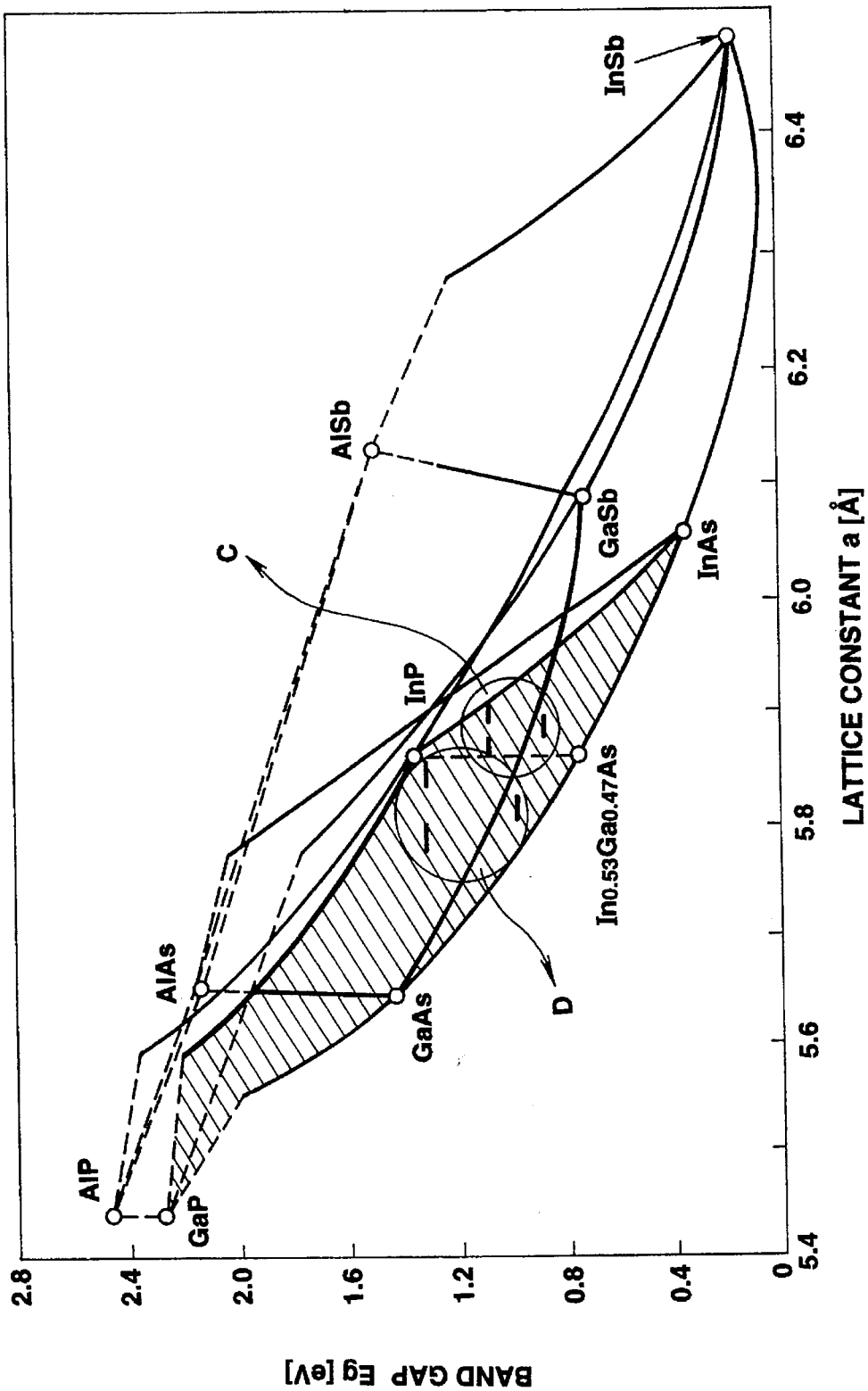
FIG. 16 is a composition phase diagram illustrating tensile and compressive strain regions.

FIG. 16 indicates a composition region (region C) in which the material composition causes compression strain in a layer with respect to an InP substrate, and a composition region (region D) in which the material causes tensile strain. An example of the material compositions and mole fraction variations useful for fabricating a quantum well structure such as that described in connection with FIG. 3, is set forth in the Table below. In the Table, x and y indicate the mole fractions in $In_xGa_{1-x}As_yP_{1-y}$, of Ga and As, respectively, and Δ a indicates the difference in 1 the lattice constant.

TABLE

| Layer | Mole Fraction Variations in $In_xGa_{1-x}As_yP_{1-y}$ | | Lattice Constant Difference Δa/a (%) |
|---|---|---|---|
| | x | y | |
| Substrate | | | |
| | | | → −0.44 |
| Barrier | 0.200 ↓ 0.155 | 0.300 ↓ 0.255 | |
| | | | → −0.28 |
| Well | 0.500 ↓ 0.340 | 0.980 ↓ 0.820 | |
| | | | → +0.28 |
| Barrier | 0.030 ↓ 0.000 | 0.150 ↓ 0.140 | |
| | | | → +0.45 |
| Substrate | | | |

The quantum well structure may be fabricated by metal organic chemical vapor deposition (MOCVD), chemical beam epitaxy (CBE) or the like. Since the amounts of In, P, Ga and As can be independently controlled in these fabrication methods, the desired compositions can be readily obtained.

As described in the foregoing, according to the present invention, strain in a quantum well structure is caused to vary and means for applying a voltage from outside is arranged in a device. Thus, an optical device, such as a semiconductor laser that can change the polarization state of output light by changing the applied voltage, has been described.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. An optical device comprising:

a substrate on which a strained quantum well structure is formed;

a strained quantum well structure formed on said substrate, said strained quantum well structure having at least one well layer and a plurality of barrier layers, said well layer being sandwiched between said barrier layers, wherein a lattice constant of said well layer varies within said well layer so that a band end of heavy holes of said well layer and a band end of light holes of said well layer cross in said well layer;

at least one of current injecting means for injecting current into said well layer and reverse-voltage applying means for applying a reverse voltage to said well layer; and voltage applying means for applying a voltage to said well layer independently from said at least one of current injecting means and reverse-voltage applying means.

2. An optical device according to claim 1, wherein said quantum well structure comprises a single quantum well structure consisting of two barrier layers and a single well layer sandwiched between said two barrier layers.

3. An optical device according to claim 1, wherein said quantum well structure comprises a multiple quantum well structure having a plurality of single quantum well structures each including two barrier layers and a single well layer.

4. An optical device according to claim 1, wherein said device is adapted to operate as a semiconductor laser.

5. An optical device according to claim 1, further comprising antireflection coatings provided on end facets of said strained quantum well structure, said end facets being formed partially on said ends of said optical device, and wherein said device is adapted to operate as a semiconductor optical amplifier.

6. An optical device according to claim 1, wherein said device is adapted to operate as an absorption type optical modulator.

7. An optical device according to claim 1, wherein material of said well layer has a plurality of mole fraction, and each band gap energy of said material corresponding to said plurality of mole fraction is unchanged when strain effects are not considered.

8. An optical device according to claim 1, wherein a lattice constant varies in each of said two barrier layers and the lattice constant monotonically varies in said single quantum well structure including said two barrier layers and a single well layer sandwiched between said two barrier layers.

9. An optical device according to claim 1, wherein a lattice constant does not vary in each of said barrier layers, and the lattice constant monotonically varies only in said well layer.

10. An optical device according to claim 1, wherein material of said well layer has a plurality of mole fraction, and each band gap energy of said material corresponding to said plurality of mole fraction is gradually changed into a layer-forming direction.

11. An optical device according to claim 1, wherein an inclined direction representing a change of each band gap energy of the material corresponding to the plurality of mole fraction in the layer-forming direction is a plus direction when an inclined direction representing a change of each lattice constant of the material corresponding to the plurality of mole fraction in the layer-forming direction is a minus direction, or the inclined direction representing the change of each band gap energy of the material corresponding to the plurality of mole fraction in the layer-forming direction is a minus direction when the inclined direction representing the change of each lattice constant of the material corresponding to the plurality of mole fraction in the layer-forming direction is a plus direction.

12. An optical device according to claim 1, wherein a band structure of said well layer is defined so that a transition in said well layer can be changed by applying a voltage to said well layer between a first state in which a transition between an energy level of an electron and an energy level of a heavy hole is dominant and a second state in which a transition between an energy level of a electron and an energy level of a light hole is dominant.

* * * * *

UNITED STATES PATENT AND TRADEMARK OFFICE
CERTIFICATE OF CORRECTION

PATENT NO. : 5,606,176

DATED : February 25, 1997

INVENTOR : JUN NITTA

It is certified that error appears in the above-identified patent and that said Letters Patent is hereby corrected as shown below:

ON TITLE PAGE

[56] References cited - Under ""Strained-Layer In GaAs" etc., "22th Conf." should read --22nd Conf.--.

COLUMN 2

Line 14, "vary-from" should read --vary from--;
Line 28, "destribution" should read --distribution--;
Line 37, "destribution" should read --distribution--;
Line 47, "distribution" should read --distribution--.

COLUMN 3

Line 59, "he" should read --the--.

COLUMN 4

Line 1, "drop," should read-- drop.--;
Line 65, "desribed" should read --described--.

UNITED STATES PATENT AND TRADEMARK OFFICE
CERTIFICATE OF CORRECTION

PATENT NO. : 5,606,176

DATED : February 25, 1997

INVENTOR : JUN NITTA

It is certified that error appears in the above-identified patent and that said Letters Patent is hereby corrected as shown below:

<u>COLUMN 8</u>

Line 45, "of a" should read --of an--.

Signed and Sealed this

Fifth Day of August, 1997

Attest:

BRUCE LEHMAN

Attesting Officer

Commissioner of Patents and Trademarks